United States Patent
Christenson et al.

(10) Patent No.: US 6,835,667 B2
(45) Date of Patent: Dec. 28, 2004

(54) METHOD FOR ETCHING HIGH-K FILMS IN SOLUTIONS COMPRISING DILUTE FLUORIDE SPECIES

(75) Inventors: Kurt K. Christenson, Minnetonka, MN (US); Thomas J. Wagener, Shorewood, MN (US); Neil Bruce Rosengren, Plymouth, MN (US); Brent D. Schwab, Burnsville, MN (US)

(73) Assignee: FSI International, Inc., Chaska, MN (US)

(*) Notice: Subject to any disclaimer, the term of this patent is extended or adjusted under 35 U.S.C. 154(b) by 14 days.

(21) Appl. No.: 10/172,795

(22) Filed: Jun. 14, 2002

(65) Prior Publication Data

US 2003/0235985 A1 Dec. 25, 2003

(51) Int. Cl.[7] ............................................. H01L 21/461
(52) U.S. Cl. ...................................... 438/745; 438/689
(58) Field of Search ............................... 438/689, 691, 438/745, 754–756

(56) References Cited

U.S. PATENT DOCUMENTS

| | | |
|---|---|---|
| 3,607,480 A | 9/1971 | Harrap et al. |
| 3,709,749 A | 1/1973 | Sato et al. |
| 4,269,654 A | 5/1981 | Deckert et al. |
| 5,382,296 A | 1/1995 | Anttila |
| 6,200,891 B1 | 3/2001 | Jagannathan et al. |
| 6,254,796 B1 | 7/2001 | Rath et al. |
| 6,300,202 B1 | 10/2001 | Hobbs et al. |
| 6,329,299 B1 | 12/2001 | Wu et al. |
| 2001/0041267 A1 * | 11/2001 | Harakawa et al. ........... 428/680 |
| 2002/0037820 A1 * | 3/2002 | Small et al. ................. 510/175 |
| 2002/0127859 A1 * | 9/2002 | Wu ............................. 438/689 |
| 2003/0087532 A1 | 5/2003 | Wu et al. |

OTHER PUBLICATIONS

Knotter, D. Martin, "Etching Mechanism of Vitreous Silicon Dioxide in HF–Based Solutions," J. Am. Chem. Soc., vol. 122, pp. 4345–4351 (2000).

Knotter, D. Martin, et al., "Etching Mechanism of Silicon Nitride in HF–Based Solutions," J. Electrochemical Soc., vol. 3, F43–F46 (2001).

Verhaverbeke et al., "The Etching Mechanisms of $SiO_2$ in Hydrofluoric Acid," J. Electrochemical Soc., vol. 141, pp. 2852–2857 (1994).

Chambers, J. J. et al., "Effect of Composition and Post–Deposition Annealing on the Etch Rate of Hafnium and Zirconium Silicates in Dulute HF," Proc. 7th Intl. Symp. on Cleaning Technology in Semiconductor Device Mfg., Electrochemical Society, vol. 2001–26, pp. 359–365 (2001).

Deckert, C.A., "Etching of CVD $Si_3N_4$ in Acidic Fluoride Media," J. Electrochemical Soc., vol. 125, pp. 320–323 (1978).

Deckert, C.A., "Pattern Etching of CVD $Si_3N_4SiO_2$ Composities in HF/Glycerol Mixtures," J. Electrochemical Soc., 127(11), 2433–2438 (1980).

Wallace, R.M. et al., "High–K Gate Dielectric Materials," MRS Bulletin, vol. 27, pp. 192–197 (2002).

Schlom, D.G., "A Thermodynamic Approach to Selecting Alternative Gate Dielectrics," MRS Bulletin, vol. 27, pp. 198–204 (2002).

Itano et al., "Selective and Non–Selective Wet Etching by Low–Relative Dielectric Constant Solvent Containing Fluorine Compound," presented at the International Sematech Wafer Clean and Surface Prep Workshop, May 21, 2002, Sematech International, Austin, Texas.

Wolf et al., "Silicon Processing for the VLSI Era, vol. 2–Process Integration" Lattice Press, pp. 298–367 (1990).

Lang's Handbook of Chemistry, 15th ed., McGraw Hill, NY, p. 11.99 (1999).

* cited by examiner

Primary Examiner—Dung A. Le
(74) Attorney, Agent, or Firm—Kagan Binder, PLLC

(57) ABSTRACT

A process for etching high dielectric constant (high-k) films (e.g., $Zr_zSi_yO_x$, $Hf_zSi_yO_x$, $Zr_zHf_yO_x$, $Hf_zAl_yO_x$, and $Zr_zAl_yO_x$) more rapidly than coexisting $SiO_2$, polysilicon, silicon and/or other films is disclosed. The process comprises contacting the films with an aqueous solution comprising a fluoride containing species at a concentration sufficiently dilute to achieve a desired selective etch of the high-k film. The etching solution is preferably used above ambient temperature to further increase the etch selectivity of the high-k films relative to coexisting $SiO_2$ and/or other films. The etch rate of the solution can also be adjusted by controlling the pH of the etching solution, e.g., by the addition of other acids or bases to the solution (for example, HCl or $NH_4OH$).

34 Claims, No Drawings

METHOD FOR ETCHING HIGH-K FILMS IN SOLUTIONS COMPRISING DILUTE FLUORIDE SPECIES

FIELD OF INVENTION

This invention relates to the etching of thin films during the production of devices such as integrated circuits, and more particularly, to the use of solutions containing very dilute fluoride species to etch high-k materials.

BACKGROUND OF INVENTION

Most integrated circuits currently produced are manufactured on thin disks of silicon and/or other semiconductor material (wafers) using "complementary metal oxide semiconductor" (CMOS) technology. A general discussion of CMOS technology can be found in "Silicon Processing for the VLSI Era, Volume 2—Process Integration" by Wolf et al., Lattice Press, 298–367, (1990). In a CMOS circuit, an electric potential applied to a transistor's gate electrode capacitively couples to its channel and controls the current that flows between its source and drain electrodes. The gate electrode is electrically insulated from the channel by the gate dielectric. The gate dielectric has historically utilized $SiO_2$ formed by thermally oxidizing the silicon above the channel. $SiO_2$ dielectrics have many advantages, including their ability to be removed by etching in either gas, plasma or liquid based processes.

The electrical properties of the transistor depend to a significant degree upon the nature of the gate dielectric. In particular, reducing the thickness of the dielectric increases the capacitive coupling between the gate and channel, allowing higher speed transistor operation at lower operating voltages. But, as the thickness of the dielectric is reduced much below about 2 nm, quantum tunneling effects tend to increase, allowing an electric current to flow between the gate and channel. This tunneling current is undesirable as it increases the transistor's power requirements and causes undue heat generation.

Excessive tunneling can be alleviated if the capacitive coupling between the gate and channel is increased by increasing the dielectric constant (k) of a fixed "physical" thickness of gate dielectric, $t_{phys}$. The equivalent "electrical thickness," $t_{elect}$, of a high-k gate dielectric is approximately equal to the gate's physical thickness times the ratio of the dielectric constants of $SiO_2$ and the high-k material, $k_{SiO2}$ and $k_{high-k}$, respectively. That is:

$$t_{elect} = t_{phys} * (k_{SiO2}/k_{high-k})$$

Early approaches to increasing k included "nitriding" the $SiO_2$, forming silicon oxy-nitrides ($SiO_xN_y$) of various stoichiometries. Recent work evaluating the electrical, metallurgical and chemical properties of various dielectric materials has focused upon the unary oxides of aluminum, zirconium and hafnium, mixtures of these oxides, and silicates of these elements or mixtures. A general discussion on the need for high-k dielectrics can be found in "High-k Gate Dielectric Materials," by R. M. Wallace et al., MRS Bulletin, 27 (3), 192–197, (2002). A general discussion on the selection process that leads to particular metal oxides can be found in "A Thermodynamic Approach to Selecting Alternative Gate Dielectrics," by D. G. Schlom, MRS Bulletin, 27 (3), 198–204, (2002).

A subtractive process for producing patterned dielectric features on semiconductor wafers involves depositing a film of high-k material on the wafer, and then etching the film away in areas where it is not desired. While $SiO_2$ is easily etched, the above mentioned high-k materials are highly resistant to chemical attack. Concentrated hydrofluoric acid is the only commonly used etchant for these high-k materials. HF is used, for instance, to reclaim wafers used to test a high-k film deposition process by removing the entire film, allowing their reuse in subsequent tests. In etch testing to date, high-k films that have been annealed (subject to a thermal treatment typical of the CMOS production process) typically etch much more slowly than "as deposited" films.

Unfortunately, concentrated HF also has a high etch rate on other silicon-based oxides such as $SiO_2$ formed by thermal oxidation (Tox) of silicon, $SiO_2$ formed by deposition from gas-phase tetraethylorthosilicate and oxygen or ozone (TEOS), and TEOS doped with boron and/or phosphorous (BPTEOS, BTEOS, PTEOS). This means that conventional aqueous HF solutions previously have not been practically useful for selectively etching high-k films relative to silicon oxide materials. Features formed from these silicon oxides are critical to the circuit's operation and are often necessarily present on the wafer when a high-k film is etched away. If high-k films are to be commercially viable, it is highly desired that an etching chemistry be found that can selectively etch a high-k film, with little or no etch of the other films present. Etch selectivities of at least about 1:1, more preferably greater than about 3:1, and more preferably greater than about 5:1 are desired. Silicon oxides typically etch faster than these high-k films in concentrated HF, with selectivities of high-k film to silicon oxide being in a range from 1:10 to even 1:100.

The situation is somewhat similar to that of selectively etching silicon nitride ($Si_3N_4$) in the presence of $SiO_2$. Deckert initially investigated selective etching of $Si_3N_4$ in aqueous fluoride media, but was unable to achieve the desired etch selectivities (C. A. Deckert, "Etching of CVD $Si_3N_4$ in Acidic Fluoride Media," J. Electrochemical Soc., 125 (2), 320–323 (1978)). Deckert then pursued etching in HF/organic solvent mixtures and was able to achieve a 2.5:1 selectivity with 2 wt % HF in glycerol at 110° C. (C. A. Deckert, "Pattern Etching of CVD $Si_3N_4$/$SiO_2$ Composites in HF/Glycerol Mixtures," J. Electrochemical Soc., 127 (11), 233–2438 (1980) and U.S. Pat. No. 4,269,654 to Deckart). U.S. Pat. No. 4,269,654 also noted that 2 wt % HF in water at 96° C. gave a very poor, 1:4.5 etch selectivity of $Si_3N_4$ to $SiO_2$. Jagannathan and Rath later used HF/organic mixtures for the selective removal of $SiO_2$ without attack of coexisting metals (U.S. Pat. No. 6,200,891 to Jagannathan and U.S. Pat. No. 6,254,796 to Rath). Itano et al. has demonstrated the selective etching of unannealed $HfSiO_x$ and $ZrAlO_x$ films over thermally grown $SiO_2$ in mixtures of HF in a low dielectric constant solvent (for example, isopropyl alcohol, acetic acid, tetrahydrofuran, methanol or ethanol), (M. Itano et al., "Selective and Non-Selective Wet Etching by Low-Relative Dielectric Constant Solvent Containing Fluorine Compound," presented at the International Sematech Wafer Clean and Surface Preparation Workshop, May 21, 2002, Sematech International, Austin, Tex.).

The chemistry of aqueous HF solutions and its etch mechanisms have been investigated by Verhaverbeke and Knotter (S. Verhaverbeke et al., "The Etching Mechanisms of $SiO_2$ in Hydrofluoric Acid," J. Electrochemical Soc., 141 (10), 2852–2852, (1994); D. Martin Knotter, "Etching Mechanisms of Vitreous Silicon Dioxide in HF-Based Solutions," J. Am. Chem. Soc., 122 (18), 4345–4351, (2000)). Verhaverbeke and Knotter noted that the concentration of the various ionic species in aqueous HF (e.g., HF, $HF_2^-$, $H_2F_2$, $H^+$, $F^-$) vary with HF concentration, ascribing the etching of $SiO_2$ to $HF_2^-$ and $H_2F_2$. Knotter (2001) further investigated the etching mechanisms of $Si_3N_4$ in aqueous HF.

U.S. Pat. No. 5,382,296 to Anttila notes that aqueous HF concentrations of 0.000049 wt % to 0.049 wt % can be used near ambient temperature to clean "particles . . . as well as metallic and organic contamination" where the equivalent thickness of the metallic film is approximately $10^{-6}$ A (Angstrom=$10^{-10}$ meter), far below one monolayer of film coverage. U.S. Pat. No. 6,300,202 to Hobbs notes that "metal oxide dielectrics are not readily susceptible to wet etch processing" and proposes removing the metal-oxides by first reducing the metal-oxides to metals by annealing in a low-oxygen or hydrogen-rich environment, followed by etching the metallic metals with a wet or dry etch.

In recently published work, Chambers tested the etching of unannealed and annealed films in ambient temperature, 0.49 wt % aqueous HF, and concluded that for annealed films "Selectivities of metal silicate to silicon dioxide of <0.1 were measured, indicating the need for alternative high-k wet etch chemistries with high selectivity to silicon dioxide and silicon" (J. J. Chambers et al., "Effect of Composition and Post-Deposition Annealing on the Etch Rate of Hafnium and Zirconium Silicates in Dilute HF," Proc. 7th Intl. Symp. on Cleaning Technology in Silicon Device Mfg., Electrochemical Society, Pennington, N.J., PV 2001–26, 359).

What is needed, therefore, are etching compositions and methods that provide the desired stripping rate of high-k films present on the wafer, and more preferably the desired selectivity between the high-k films and other films present on the wafer, particularly $SiO_2$. Such compositions desirably would be effective in current semiconductor processing equipment without involving excessive cost or safety concerns.

SUMMARY OF THE INVENTION

The present invention provides technology, including processes, equipment, etching solutions, and objects fabricated thereby, applicable to etching high-k dielectric material(s) in an effective, controllable, and repeatable manner. In preferred embodiments, the principles of the present invention may be used to selectively etch high-k dielectric material(s) relative to co-existing materials that might also be present on a substrate such as a semiconductor wafer. The etching composition of the present invention is an aqueous solution that comprises an unconventionally dilute concentration of one or more fluoride species. The composition preferably is used above ambient temperatures to increase the etch rate of the high-k material(s) and, in some embodiments, to further increase the etch selectivity for high-k material relative to other co-existing materials. As an option, etch rate and/or selectivity may be controlled by adjusting the pH of the etching composition. As a further option, both temperature and pH may be used to control etch rate and/or selectivity if desired. After etching, the etched objects, e.g., semiconductor wafers, can be rinsed, dried or otherwise processed using conventional semiconductor processing techniques.

The invention can be practiced using tool sets common to the semiconductor production industry. In semiconductor production, the controlled etching of films in aqueous chemistries is a highly developed technology. Hardware and software are already available to precisely blend a solution, and thereafter to monitor and control its temperature, flow rate, concentration, pH and other solution characteristics as needed. These controls are adequate to consistently provide an etching process with repeatable, controllable results.

In one aspect, the present invention relates to a method for etching one or more microelectronic substrates, each independently comprising a dielectric material having a dielectric constant greater than about 4. The substrate is contacted with an aqueous etching solution comprising at least one fluoride species. The total fluoride concentration in the etching solution is no greater than about 0.2 weight percent.

In another aspect, the present invention relates to an aqueous etching composition. The composition comprises at least one fluoride species, wherein the total fluoride concentration in the etching solution is no greater than about 0.2 weight percent.

In another aspect, the present invention relates to a method for selectively etching a high k dielectric material relative to a co-existing material. A substrate is provided that comprises the high k dielectric material and the co-existing material. An aqueous etching composition is caused to contact the substrate. The composition comprises at least one fluoride species, wherein the total fluoride concentration in the etching solution is sufficiently dilute such that the composition etches the high k dielectric material relative to the co-existing material with a selectivity ratio of greater than about 1:1.

In another aspect, the present invention relates to an apparatus for etching one or more substrates. The apparatus comprises a chamber in which at least one substrate is positioned to carry out an etching treatment. The chamber is fluidly coupled to one or more sources of one or more ingredients that in combination constitute an aqueous etching composition. The ingredients may be combined either before or after being dispensed into the chamber. The composition comprises at least one fluoride species, wherein the total fluoride concentration in the etching solution is no greater than about 0.2 weight percent. A control system comprises functionality to at least help control the etching treatment in a manner effective to cause the aqueous etching composition to contact the at least one substrate during at least a portion of the etching treatment.

DETAILED DESCRIPTION OF THE INVENTION

The embodiments of the present invention described below are not intended to be exhaustive or to limit the invention to the precise forms disclosed in the following detailed description. Rather the embodiments are chosen and described so that others skilled in the art may appreciate and understand the principles and practices of the present invention.

The present invention provides a process for selectively etching high-k films present during the manufacture of items such as microelectronic devices. The process comprises using an aqueous etching composition to accomplish such selective etching, wherein the composition comprises a concentration of fluoride species from one or more sources that is sufficiently dilute such that the composition selectively etches a dielectric composition comprising at least one high-k dielectric material with respect to at least one other material on the microelectronic device such as $SiO_2$, silicon, polysilicon and/or other films.

In the practice of the present invention, a high-k dielectric material refers to a material comprising at least two elemental constituents in addition to optional oxygen and having a dielectric constant, k, that is greater than the dielectric constant for $SiO_2$ (k=3.8). Thus, although dielectric material of the present invention may include oxygen as a constituent, any such oxygen if present is deemed not to be one of the at least two elemental constituents.

It has been discovered that dielectric materials comprising at least two elemental constituents in addition to any optional oxygen may be favorably etched using the dilute fluoride containing etching solutions of the present invention. While not wishing to be bound by theory, it is believed that the favorable etch characteristics are related to the crystalline structure of the high-k dielectric films. Conventionally, a unary high-k dielectric material, i.e., a material comprising only one elemental constituent other than oxygen (e.g., $HfO_2$ and $ZrO_2$), are highly resistant to dilute etchants. However, it is believed that incorporating at least two elemental constituents in addition to optional oxygen disrupts the crystalline lattice to a sufficient degree such that the material is more susceptible to etching.

$SiO_2$ is a convenient reference for identifying high-k dielectric materials, as $SiO_2$ is the current dominant gate dielectric material. Switching from essentially pure $SiO_2$ to a higher k dielectric material, which may or may not be intermixed or otherwise combined with conventional $SiO_2$, is desirable in order to reduce the equivalent electrical thickness needed for a particular application. Commonly, it may be desirable to reduce the equivalent electrical thickness by a factor of at least 2 or 3, which in turn would require high-k dielectric material having a dielectric constant that is at least 2 or 3 times greater than k=3.8. Accordingly, in the practice of the present invention, preferred high-k dielectric material(s) refers to those materials having a dielectric constant of at least about 7.6, and more preferably at least about 10.

A wide variety of dielectric materials may be used as high-k dielectric materials of the invention. In some embodiments, preferred high k dielectric materials comprise at least two constituents selected from Zr, Hf, Si, Ge, Y, As, N, and Al. In such embodiments, the material may further comprise additional non-metal constituents such as B, P, combinations of these, and the like. In some embodiments, if the material comprises both Si and N, it is further preferred that such embodiments further comprise at least one additional constituent such as Zr, Hf, Ge, Y, As, B, P, combinations of these, or the like.

One class of high k dielectric materials found to be suitable in the practice of the present invention includes silicates such as those that generally have the formula $M_zSi_yO_x$, wherein M is one or more metals, y has a value such that the silicate comprises 10% to 90%, preferably 10% to 50% mole fraction Si compared to the other metal(s), and x and z are selected to satisfy stoichiometry. Such silicates optionally may also include one or more additional constituents, as desired, of which B, P, Y, As, Ge, N, Al, combinations of these, and the like are representative.

Specific examples of silicates include, e.g., $HfSiO_4$ (k=12), $ZrSiO_4$ (k=13), $Hf_{0.6}Si_{0.4}O_2$ (k of about 14, commonly referred to as HfSiO (40%)), combinations of these, and the like. Other examples of combinations of elemental oxides include $Zr_zHf_yO_x$, $Hf_zAl_yO_x$, and $Zr_zAl_yO_x$, where the ratio of z:y preferably is in the range of 1000:1 to 1:1000 and x satisfies stoichiometry. Some other materials under consideration as silicates or in combination with other metals are listed by "A Thermodynamic Approach to Selecting Alternative Gate Dielectrics," by D. G. Schlom, MRS Bulletin, 27 (3), 198–204, (2002).

High-k dielectric materials may be homogeneous (i.e., essentially pure) or heterogenous, i.e., used in combination with one or more other high-k and/or conventional dielectric materials. If heterogeneous, the materials may be intermixed, layered, and/or otherwise combined as desired. For example, one multilayer dielectric, gate structure of interest comprises three layers. A first layer typically positioned adjacent the silicon channel is formed from $SiO_2$. One or more high-k dielectric materials is used to form a middle dielectric layer. Finally, a top layer adjacent the gate electrode is formed from $SiO_2$.

The high-k films may be used in a wide variety of applications such as the fabrication of micro-electronic, micro-optical, liquid-crystal display (LCD) or micro-mechanical (MEMS) devices on any suitable substrate including, but not limited to substrates comprising Si, Ge, GaAs, SiC, $Si_3N_4$, $SiO_2$, combinations of these, and the like. For convenience, the group comprising any of these substrates will be referred to as "wafers". The present invention is usefully incorporated into one or more stages of manufacture in any such applications.

It has been observed that dilute fluoride containing species in aqueous solutions have different etch selectivities than more concentrated solutions. For example, it was observed that very dilute solutions of HF in water selectively etch the high-k films compared to TEOS and thermally grown oxides, particularly at elevated temperatures. That is, the high-k film etched faster than the TEOS reference film. TEOS was used as a reference film as it is commonly present on microelectronic devices.

The etch selectivity of an etching composition for a high-k film with respect to a co-existing film is determined by measuring the respective amounts of high-k film and reference film removed during identical exposures to an etching solution. The selectivity is then given by the ratio (thickness of high-k film removed):(thickness of reference film removed). Thus, stating the selectivity as "5:1" indicates that five times as much high-k film was removed as was reference film. The amount of film removed is typically measured by optical measurements such as ellipsometry. It is preferred that the solution etch the high-k material with a selectivity greater than about 1:1 with respect to a co-existing film, more preferably greater than about 3:1, and more preferably greater than about 5:1.

In the practice of the present invention, the selectivity of an etching solution for a high k material may be determined in some instances with reference to a TEOS film, inasmuch as TEOS is a conventional, common dielectric material in the microelectronic industry. Determining the etch selectivity of various high k dielectric materials with respect to the same kind of reference film also allows the etch selectivity for various materials to be more meaningfully compared to each other. For the purposes of the present invention, a TEOS reference film means an $SiO_2$ film deposited from a gaseous mixture that includes tetraethylorthosilicate. In the practice of the present invention, a TEOS reference film is made using the procedure described in "Silicon Processing for the VLSI Era, Volume 1—Process Technology" by Wolf et al., Lattice Press, 191–194, (2000).

The fact that sufficiently dilute, aqueous, fluoride containing solutions selectively etch high-k film(s) is very surprising. Commonly used concentrations of HF in water (0.49 wt % to 49 wt %) were tested at ambient and elevated temperatures and all etched the high-k materials much more slowly than TEOS. Yet, when the concentration of etchant is sufficiently dilute, selectivity is the opposite. The reason for the difference in etch selectivity between $SiO_2$ and high-k materials of solutions with very dilute fluoride containing species is not known. While not wishing to be bound by any theory, it is believed that the etching mechanism of $SiO_2$ differs from that of the high-k material such that dilute solutions etch high-k films more favorably.

For example, it is well known that many combinations of hydrogen and fluoride ions exist in aqueous solutions of HF. For instance, $H^+$, $F^-$, HF, $HF_2^-$ and $H_2F_2$ are believed to all be present in varying degrees. The absolute concentrations of these species is dependent upon factors including the total fluoride concentration (the sum of all fluoride containing species) and the pH of the solution ($H^+$ concentration) and other factors. $H_2F_2$ and $HF_2^-$ have been proposed as the dominant species involved in etching $SiO_2$ (Verhaverbeke 1994, Knotter 2000). Very dilute HF solutions favor F as the primary fluorine species present in solution, with some HF but very little $HF_2^-$ or $H_2F_2$ being present. Consequently, if the etching mechanism of a high-k material proceeded via the $F^-$ ion or HF molecule, the relative etch rate of the high-k material should increase compared to that of $SiO_2$ as the solution becomes more dilute. The actual basis for the increase in selectivity with increasing dilution may be related to one or more of these effects, or to some other effect that has not been considered.

The etching solution of the invention comprises a fluoride containing species in an aqueous medium. The fluoride can be provided in one or more forms including $NH_4F$, HF, buffered HF (HF and $NH_4F$), KF, combinations thereof, and the like. HF is the preferred form. Many combinations of hydrogen and fluoride ions exist in aqueous solutions of HF; $H^+$, $F^-$, HF, $HF_2^-$ and $H_2F_2$ are all present in varying degrees. It is believed that polyatomic species such as $HF_2^-$ and $H_2F_2$ are dominant in concentrated HF solutions, while the monatomic species $F^-$ is relatively more dominant in very dilute solutions. The addition of other chemical species such as $NH_4OH$ allows the creation of other species in solution such as the buffering $NH_4F$ (which exists as $NH4^+$ (aq) and $F^-$ (aq) generally), which is generally considered to not take part in the etching process.

The fluoride concentration in the etching solution is sufficiently dilute to achieve the desired etch rate and selectivity. If the etch rate is too high, and/or the selectivity too low, the solution may be further diluted if desired. The fluoride concentration is preferably no greater than about 0.2 wt %, more preferably in the range of 0.0001 wt % to 0.2 wt %, even more preferably in the range of 0.001 wt % to 0.1 wt %, and most preferably in the range of 0.005 wt % to 0.05 wt %.

The pH of the etching solution has a strong effect on the etch rates of both high-k and $SiO_2$ containing films. Increasing the pH of the etching solution has been shown to generally slow the etch rates of the films. But with decreasing pH, the etch rate of the high-k material rose slightly while the etch rate of the $SiO_2$ fell. This is consistent with Knotter's (2001) findings that the etch rate of $SiO_2$ is not a simple function of pH. The selection of the optimum solution chemistry (e.g., fluoride species concentration, pH, temperature etc.) will require an evaluation of all of the films on the wafer along with conditions imposed by the hardware set, environmental concerns, etc.

It is possible to adjust the pH of the solution downward by the addition of an acid (e.g. HCl, $H_2SO_4$, $CH_3COOH$, combinations of these, etc.) and upward by the addition of a base (e.g. $NH_4OH$, KOH, $N(CH_3)_4OH$, etc.). For example, a solution of 0.05 wt % HF in water has a pH of approximately 2.4. The addition of 3.8 ml of 37% HCl per liter of HF solution shifts the pH downward to approximately 1.4. The addition of approximately 1.25 ml of 35 wt % $NH_4OH$ per liter of HF solution shifts the pH upward to approximately 3.4. In the present embodiments, the pH of the solution preferably is acidic and more preferably may be in the range of about 0 to about 2, alternatively about −1 to about 1, alternatively about 1 to about 3, alternatively about 3 to about 5, and alternatively about 5 to about 6.5.

Other ingredients can be added to the etching solution to accomplish other purposes in accordance with conventional practices as such practices are constituted from time to time. For instance, a surfactant such as 3,5-dimethylhexyne-3-ol can be added to reduce the surface tension of the solution and improve wetting of the films. Likewise, a chelating or complexing agent such as EDTA (ethylenediaminetetraacetic acid) can be added to bind metals in the solution and reduce metallic contamination remaining on the films or wafers after the etching process. In some cases, chelating and complexing agents themselves are effective in removing metal compounds. For instance, dilute solutions containing diammonium EDTA are used to remove calcium and other scale from equipment. Therefore, solutions of chelating or complexing agents may themselves be capable of etching high-k films, particularly with the addition of an acid or base to adjust the pH of the solution.

In some instances, hot water itself can etch silicon. It is believed that $O_2$ dissolved in the water may be implicated. Accordingly, in those modes of practicing the invention in which it may be desirable to suppress etching of unoxidized films, it may be desirable to provide an etching solution in which the dissolved $O_2$ content is minimized and/or incorporate an appropriate amount of reducing agent such as $H_2$ into the solution. A typical supply of deionized water to be used in an etching solution may contain 0.1 to 10 ppm dissolved oxygen. To alleviate etching of unoxidized film, this may be reduced to a level of 0.05 ppm or less. Most commonly, a de-oxygenating treatment is applied to an aqueous fluid before adding fluoride containing species to the fluid, especially when the fluoride containing species is HF gas. Because HF is a gas, it would tend to at partially come out of solution in a typical degassification module. Methods of de-oxygenating are well known and any conventional technique, as such may be constituted from time to time, may be used. An example of one suitable de-oxygenating technique is described in the operating instructions for the Separel(tm) EFM-530 Degasification Module (Pall Corporation, East Hills, N.Y.).

In those embodiments in which a reducing agent is incorporated into an etching solution, an appropriate amount of reducing agent may be used based upon any suitable criteria as desired. One representative criteria is the effect of added reducing agent upon the oxidation-reduction potential (ORP) of the etching solution. For instance, enough reducing agent may be used to lower the oxidation-reduction potential of the solution to some threshold voltage, e.g., less than, for instance, 0.2 volts, above the oxidation-reduction potential of perfectly degassed water, measured at the pH of the etching solution.

The etching solutions of the present invention can be made in accordance with conventional practices as such are constituted from time to time that provides the desired composition. For instance, solutions of dilute HF in water can be made by mixing stock, concentrated HF with water. Solutions of dilute HF with adjusted pH can be created by the addition of other acids or bases to the aqueous HF mixture. Additionally, gaseous precursors can be dissolved in water to create one or more components of the solution (e.g., anhydrous HF, HCl or $NH_3$ gas). The fluoride ion species can also be provided in forms other than HF such as supplying F—from $NH_4F$ and adjusting the pH of the solution by the addition of HCl. The etching solution can be supplied premixed or as a concentrate from a commercial source. Or, the solution can be blended on-site and delivered to the process tool, blended on-demand in the process tool, or even created by blending any gaseous, liquid or solid precursors within the process chamber. Any combination of these techniques is also contemplated.

The etching process(es) and solution(s) can be used in any equipment where the etching solution is able to contact and etch the high-k material. For instance, the wafers with the high-k material can be immersed in a bath of the etching solution, either static, cascading or otherwise flowing, as in a wet bench. The wafers may be etched either singly or in groups. Likewise, the etching solution can be sprayed on a single wafer, as in a single-wafer spin processor, or on a group of wafers, as in a centrifugal spray processor (for example, the ZETA® or MERCURY® centrifugal spray processors from FSI International, Chaska, Minn.). The etching solution can also be made in-situ by the combination of HF gas and water in a single-wafer processor (for example, the EXCALIBUR® single-wafer processor from FSI International, Chaska, Minn.). Some of these equipment sets can couple acoustic energy preferably in the kilohertz or megahertz frequency range into the process liquids. This energy can cause a bulk motion of the liquid (acoustic streaming) that can increase the mass transfer rates in the solution. An increase in the mass transfer rate may result in an increase in the etch rate.

In the embodiments in which the etching solution is supplied as a flow, the flow rate(s) will tend to be selected based upon factors including the type(s) of equipment being used. Immersion baths can be static, but typically recirculate approximately 0.1 to 1 or more bath volumes per minute through a temperature control apparatus and a filter. Single-wafer spray processors typically flow approximately 0.5 lpm (liter per minute) to 2 lpm of process liquid, while batch spray processors typically flow from 1.5 lpm to 10 lpm of liquid solutions. For example, single-wafer processors blending HF gas and DI water (deionized, very pure water) in the process chamber might flow 1 lpm of water into the chamber along with e.g. 560 sccm of anhydrous HF gas, to create 0.05 wt % HF. The similarity between the etch results noted below in the examples utilizing a small, static volume of etching solution and a centrifugal spray processor with high cross-wafer flow rates indicates that the flow rate of etching solution over the wafer is not critical.

In conventional solutions with a fluoride concentration in the range of 0.5 wt % to 49 wt %, increasing the solution temperature tends to increase the etch rates of films, but is conventionally thought to have little, if any, effect on the etch selectivity of one film over another. In other words, in conventional thinking, selectivity is substantially independent of temperature in practical operating regimes. But in more dilute solutions temperature is more significant. For example, with respect to 0.05 wt % or less HF solutions, the etch rates of high-k materials tends to increase with temperature as expected, but the etch rate of $SiO_2$ does not increase substantially. Therefore, the etch selectivity between the high-k material and the $SiO_2$ increases dramatically with temperature.

Temperature selection is based on many factors including desired etch rate and selectivity, and the hardware limitations of the etching equipment. Because the etch selectivity increases with increasing temperature, and the etch rates also increase with increasing temperature, more dilute and therefore less costly etching solutions can be used at elevated temperatures. The etch is preferably performed near the upper limit available in the available processing hardware. Etching in conventional hardware with aqueous solutions is typically limited to temperatures below approximately 100° C., the boiling point of water. However, higher temperatures could be employed in a chamber pressurized above 1 atmosphere of pressure. At atmospheric pressures, the temperature of the etching solution may be at any suitable temperature such as at any temperature above 1° C., and more typically between 1° C. and 99° C. In preferred modes of practice, the etching solution is greater than ambient temperature, preferably at least about 35° C., more preferably at least about 40° C. (40° C. to 99° C. at ambient pressure), more preferably at least about 75° C. (75° C. to 99° C. at ambient pressure).

While not wishing to be bound by theory, the increase in selectivity with increasing temperature may be related to differing activation energies for the $SiO_2$ and high-k etch processes. The activation energy of a chemical reaction is typically determined by measuring the increase in reaction rate due to an increase in temperature. The rates of reactions with high activation energies increases more quickly with increasing temperature than the rates of reactions with low activation energies. Our data is consistent with the activation energy of the high-k etch reaction being larger than that of the $SiO_2$ etch reaction. Alternately, the increase in selectivity may be related to a variation in the balance of fluoride containing species with temperature. The actual basis for the increase in selectivity with increasing temperature may be related to one or more of these effects, or to some other effect that has not been considered.

The etch rates are controllable by varying the fluoride concentration, temperature and/or pH of the etching solution. Additionally, as shown in the tables in the examples below, the etch rate of high-k films depends upon the composition of the high-k film.

The principles of the present invention will now be described further with reference to the following illustrative examples. The films studied include the silicates $Hf_zSi_yO_x$ (40% to 80% silicon content and z and x selected in such compositions to satisfy stoichiometry), and $Zr_zSi_yO_x$. Reference films included TEOS $SiO_2$ and Tox $SiO_2$. The percentage value listed after the $Hf_zSi_yO_x$ indicates the percent silicon oxide in the mixture. All high-k films received an anneal treatment after deposition representative of the thermal cycling that the films would receive in a CMOS process flow before being etched. For convenience, the group comprising any of these films, or other films that might be present will be referred to as "films".

In the following examples, unless otherwise noted, film-covered 200 mm wafers were cleaved into approximately 2 cm by 2 cm squares and immersed in the etching solution in 50 ml polyethylene containers. For etch temperatures above 100° C., PFA (perfluoro oxyalkane) containers were used. The containers were normally capped to prevent the evaporation of the chemistries and heated in a water or polyethylene glycol (n=4) bath as required. After being etched, each sample was rinsed in running DI water and blown dry with nitrogen. The etch rate of the films was determined by pre and post etch film thickness measurements with a Rudoph Caliber 300 ellipsometer (Rudolf Research, Flanders, N.J.). For very small film removals, the error in the thickness measurements can dominate the measured value, even leading to negative etch values (an apparent thickening of the film). All etch selectivities are referenced to annealed TEOS films.

EXAMPLE 1

Comparison Etching Compositions

Table 1 lists conventional liquid etching and cleaning chemistries that were unsuccessful at etching and/or selectively etching high-k materials compared to TEOS. With the exception of relatively concentrated HF solutions, the etch rates were either unmeasureably small or too low for practical use, or showed poor selectivity. 49 wt % HF solutions at 20° C. and 80° C. rapidly etched all of the high-k films tested, but etched the TEOS films even more rapidly, resulting in poor selectivity. 0.49 wt % HF at 20° C. etched the high-k films at acceptable rates of tens of Angstrom per minute, but etched TEOS at comparable rates, again yielding poor selectivity.

TABLE 1

Comparison etching solutions.

| Etchant | Temperature | Result |
|---|---|---|
| $H_2SO_4$ | 95° C., 150° C. | Slow*, Slow ($ZrO_2$ etched ~1 A/min at 150° C.) |
| HCl | 85° C. | Slow |
| $H_2O_2$ | 85° C. | Slow |
| $H_3PO_4$ | 85° C., 150° C. | Slow, Slow ($ZrO_2$ etched ~1 A/min at 150° C.) |
| $NH_4OH$ | 50° C. | Slow |
| $HNO_3$ | 70° C. | Slow |
| $N(CH_3)_4OH$ | 50° C. | Slow |
| KOH | 20° C., 80° C. | Slow, Damage |
| Fuming $H_2SO_4$ | 150° C. | Slow ($ZrO_2$ etched ~1 A/min) |
| 49% HF | 20° C., 85° C. | Poor selectivity |
| 0.49% HF | 20° C., 80° C. | Poor selectivity |

*Slow means that all high-k films etched less than 1 A/min (angstroms per minute).

EXAMPLE 2

Etch Selectivity vs HF Concentration and Temperature

Table 2 shows the etch rate for high-k films in various HF chemistries. In all cases, the etch rate for a given film and HF concentration increases with temperature as expected. And with the exception of ZrSiO in 0.0049% HF, the etch rate of a given film decreases with decreasing HF concentration. Table 3 shows the etch selectivity to TEOS of each chemistry. Etch selectivities generally improved with reduced HF concentration, particularly at elevated temperatures.

It is preferred that an etching solution etches a high-k film at an etch rate greater than 1 A/min, and its etch selectivity favoring a high-k film relative to TEOS be greater than 1:1, preferably greater than 3:1 and more preferably greater than 5:1. The inventive etching solution provides these etch selectivities and rates. Underlined entries in Table 2 and Table 3 indicate the current best practice for each respective film. While all best-practice etches were at elevated temperature, the preferable HF concentration varied among the high-k films. It is likely that a more preferable HF etchant concentration and temperature for any given combination of films lies between or beyond the tested concentrations and temperatures.

TABLE 2

Etch rate in A/min of various high-k films as a function of HF concentration and temperature.

| Chemistry | Temp ° C. | $Zr_zSi_yO_x$* | $Hf_zSi_yO_x$ (40%) | $Hf_zSi_yO_x$ (60%) | $Hf_zSi_yO_x$ (80%) | TEOS |
|---|---|---|---|---|---|---|
| 0.49 wt % HF | 20 | 26.00 | | 74.50 | 41.30 | 48.00 |
| 0.049 wt % HF | 20 | 1.35 | | 2.28 | 0.85 | 2.24 |
| 0.49 wt % HF | 80 | >128.1 | | >232.4 | >161.2 | 426.90 |
| 0.049 wt % HF | 80 | <u>29.60</u> | <u>60</u> | 11.90 | 4.80 | 5.0 |
| 0.016 wt % HF | 80 | 5.30 | | <u>3.40</u> | 0.90 | 0.60 |
| 0.0049 wt % HF | 80 | 8.06 | 4.5 | 1.99 | <u>0.90</u> | 0.09 |

*Silicon content was unknown.

TABLE 3

Etch selectivity of various high-k films as a function of HF concentration and temperature.

| Chemistry | Temp ° C. | $Zr_zSi_yO_x$* | $Hf_zSi_yO_x$ (40%) | $Hf_zSi_yO_x$ (60%) | $Hf_zSi_yO_x$ (80%) | TEOS |
|---|---|---|---|---|---|---|
| 0.49 wt % HF | 20 | 0.5 | | 1.5 | 0.86 | 1.00 |
| 0.049 wt % HF | 20 | 0.6 | | 1.0 | 0.38 | 1.00 |
| 0.49 wt % HF | 80 | 0.3 | | 0.5 | 0.38 | 1.00 |
| 0.049 wt % HF | 80 | <u>6</u> | <u>12</u> | 2.4 | 0.94 | 1.00 |
| 0.016 wt % HF | 80 | 8.8 | | <u>5.7</u> | 1.5 | 1.00 |
| 0.0049 wt % HF | 80 | 90 | 50 | 22 | <u>10</u> | 1.00 |

*Silicon content was unknown

EXAMPLE 3

Etch Selectivity vs pH

Table 4 shows the etch rate and selectivity to TEOS of HfSiO (40%) in 80° C., 0.049 wt % HF whose pH has been adjusted by the addition of HCl or $NH_4OH$. In this case, the etch rate of the high-k film again decreased rapidly with increasing pH, while the TEOS etch rate decreased more slowly. The increase in pH results in a degradation in etch selectivity. It may even be possible to achieve greater high-k etch rates and selectivities by further reductions in the pH of the etching solution.

TABLE 4

Etch rate in A/min and selectivity to TEOS in 0.049 wt % HF at 80° C. The pH of the solution was adjusted by the addition of $NH_4OH$.

| pH | $Hf_zSi_yO°C_x$ (40%) Etch A/min | TEOS Etch A/min | $Hf_zSi_yO°C_x$ (40%) Selectivity to TEOS |
|---|---|---|---|
| 0.5 | 86 | 3.7 | 23 |
| 1.0 | 74 | 3.5 | 21 |

TABLE 4-continued

Etch rate in A/min and selectivity to TEOS in 0.049 wt % HF at 80° C.
The pH of the solution was adjusted by the addition of NH$_4$OH.

| pH | Hf$_z$Si$_y$O°C$_x$ (40%) Etch A/min | TEOS Etch A/min | Hf$_z$Si$_y$O°C$_x$ (40%) Selectivity to TEOS |
|---|---|---|---|
| 1.5 | 70 | 4.9 | 14 |
| 2.5 | 58 | 7.0 | 8.3 |
| 3.7 | 8.0 | 3.25 | 2.5 |

EXAMPLE 4

Etching in a Spray Processor

Samples were etched in an FSI MERCURY® centrifugal spray processor. The process sequence was as follows:

Load the test wafer into the tool's process chamber along with 99, non-test wafers used to fill all available positions in the four cassettes mounted on the chamber's turntable. When processing cleaved samples, the samples were attached to a 200 mm diameter plate which was inserted in place of the test wafer.

Flow 60 lpm of nitrogen into the chamber for 30 seconds with the turntable rotating at 200 rpm.

Flow 9.5 lpm of 80° C. DI water, atomized with 60 lpm of nitrogen, onto the wafers for 10 min at 200 rpm to preheat the wafers and chamber.

Flow 9.5 lpm of an 80° C. mixture of HF and DI water, atomized with 60 lpm of nitrogen, onto the wafers for a time at 200 rpm. The HF concentration and exposure time varied between tests.

Flow 9.5 lpm of 80° C. DI water, atomized with 60 lpm of nitrogen, onto the wafers for 1 min at 200 rpm to initially rinse the samples.

Perform a post-etch rinse and dry process sequence that is typical to the MERCURY® spray processor.

As seen in Table 5, the etch rates and selectivities are comparable between the immersion processes described above and spray processes of this example. As a further test, an uncleaved, 200 mm silicon wafer with a ZrSiO (40%) film was etched for 9 minutes at 80° C. in 0.0049 wt % HF. The etch removed an average of 59.26 A with a range of etches across the wafer from 54.15 A to 64.31 A. A full TEOS wafer etched for 6 min showed an average removal of 2.99 A with a range 2.19 A to 5.15 A, confirming the high selectivity of the etch chemistry.

TABLE 5

Etch rates in A/min of various films immersed in etchant and in a spray processor.

|  | Zr$_z$Si$_y$O$_x$ | Hf$_z$Si$_y$O$_x$ (60%) | Hf$_z$Si$_y$O°$_x$ (80%) | TEOS |
|---|---|---|---|---|
| 0.049 wt % HF - Immersion | >29.6 | 25 | 14.8 | 5.0 |
| 0.04 wt % HF - Spray | 80 | 68.0 | 14.8 | 9.9 |
| 0.0049 wt % HF - Immersion | >8.1 | 1.4 | 0.2 | 0.09 |
| 0.0049 wt % HF- Spray | 12.7 | 1.9 | 0.3 | 0.1 |

Other embodiments of this invention will be apparent to those skilled in the art upon consideration of this specification or from practice of the invention disclosed herein. Various omissions, modifications, and changes to the principles and embodiments described herein may be made by one skilled in the art without departing from the true scope and spirit of the invention which is indicated by the following claims.

We claim:

1. A method for etching one or more microelectronic substrate(s) comprising a dielectric material having a dielectric constant greater than about 10, said method comprising the step of contacting the substrate with an aqueous etching solution comprising at least one fluoride species, wherein the total fluoride concentration in the etching solution is no greater than about 0.2 weight percent.

2. The method of claim 1, wherein the total fluoride concentration in the etching solution is no greater than about 0.1 weight percent.

3. The method of claim 1, wherein the total fluoride concentration in the etching solution is in the range of from about 0.0001 weight percent to about 0.05 weight percent.

4. The method of claim 1, wherein the total fluoride concentration in the etching solution is in the range of from about 0.001 weight percent to about 0.1 weight percent.

5. The method of claim 1, wherein a temperature of the etching solution is greater than ambient temperature.

6. The method of claim 1, wherein a temperature of the etching solution is greater than about 35° C.

7. The method of claim 1, wherein a temperature of the etching solution is greater than about 75° C.

8. The method of claim 1, wherein a temperature of the etching solution is greater than about 100° C. and wherein the etching solution is caused to contact the substrate at a pressure greater than 1 atm.

9. The method of claim 1, wherein a temperature of the etching solution is in the range from about 40° C. to about 99° C.

10. The method of claim 1, wherein a high k dielectric material comprises at least two constituents selected from the group consisting of Zr, Hf, Si, Ge, Y, and Al.

11. The method of claim 10, wherein the high k dielectric material further comprises at least one constituent selected from the group consisting of P, B, N, and combinations thereof.

12. The method of claim 1, wherein a high k dielectric material is a silicate comprising at least one of Zr, Hf, Al, and Y.

13. The method of claim 1, wherein a high k dielectric material is a silicate comprising at least one of Zr and Hf.

14. The method of claim 1, wherein the etching solution has an acidic pH.

15. The method of claim 1, wherein the etching solution has a pH in the range of about 0 to about 2.

16. The method of claim 1, wherein the etching solution has a pH in the range of about −1 to about 1.

17. The method of claim 1, wherein the etching solution has a pH in the range of about 1 to about 3.

18. The method of claim 1, wherein the etching solution has a pH in the range of about 3 to about 5.

19. The method of claim 1, wherein the etching solution has a pH in the range of about 5 to about 6.5.

20. The method of claim 1, further comprising directing acoustic energy into the etching solution during at least a portion of the time that the etching solution contacts the one or more substrates.

21. The method of claim 1, wherein a step of causing the etching solution to contact the substrate comprises dispensing the etching solution into a process chamber in a manner such that at least a portion of the solution etchingly contacts the one or more substrates.

22. The method of claim 1, wherein a step of causing the etching solution to contact the substrate comprises at least partially immersing the substrate in the etching solution.

23. The method of claim 1, further comprising a step of lowering the oxidation reduction potential of the etching solution by causing a reducing agent to contact at least one constituent of the etching solution.

24. The method of claim 23, wherein the reducing agent comprises $H_2$.

25. A method of selectively etching a high k dielectric material relative to a co-existing material, comprising the steps of;
  providing a substrate comprising the high k dielectric material and the co-existing material, wherein the high k dielectric material has a dielectric constant greater than about 10;
  causing an aqueous etching composition to contact the substrate, said composition comprising at least one fluoride species, wherein the total fluoride concentration in the etching solution is sufficiently dilute such that the composition etches the high k dielectric material relative to the co-existing material with a selectivity ratio of greater than about 1:1.

26. The method of claim 10, wherein the high k dielectric material further comprises the constituent N.

27. A method for etching one or more microelectronic substrate(s) comprising a dielectric material, wherein the dielectric material comprises at least two constituents selected from the group consisting of Zr, Hf, Si, Ge, Y, and Al, said method comprising the step of contacting the substrate with an aqueous etching solution comprising at least one fluoride species, wherein the total fluoride concentration in the etching solution is no greater than about 0.2 weight percent.

28. A method of selectively etching a high k dielectric material relative to a co-existing material, comprising the steps of;
  providing a substrate comprising the high k dielectric material and the co-existing material, wherein the high k dielectric material comprises at least two constituents selected from the group consisting of Zr, Hf, Si, Ge, Y, and Al;
  causing an aqueous etching composition to contact the substrate, said composition comprising at least one fluoride species, wherein the total fluoride concentration in the etching solution is sufficiently dilute such that the composition etches the high k dielectric material relative to the co-existing material with a selectivity ratio of greater than about 1:1.

29. A method for etching one or more microelectronic substrate(s) comprising a dielectric material having a dielectric constant greater than about 4, said method comprising the step of contacting the substrate with an aqueous etching solution comprising at least one fluoride species, wherein the total fluoride concentration in the etching solution is no greater than about 0.2 weight percent and wherein the concentration of dissolved oxygen in the etching solution is less than about 1 ppm on a weight basis.

30. The method of claim 29, wherein a high k dielectric material has a dielectric constant greater than about 10.

31. The method of claim 29, wherein a high k dielectric material comprises at least two constituents selected from the group consisting of Zr, Hf, Si, Ge, Y, and Al.

32. A method for etching one or more microelectronic substrate(s) comprising a dielectric material having a dielectric constant greater than about 4, said method comprising the step of:
  providing an aqueous etching solution comprising at least one fluoride species, wherein the total fluoride concentration in the etching solution is no greater than about 0.2 weight percent;
  subjecting an aqueous fluid to a deoxygenating treatment that helps to reduce the concentration of dissolved oxygen in the fluid;
  incorporating the treated fluid into the etching solution; and
  contacting the substrate with the aqueous etching solution.

33. The method of claim 32, wherein a high k dielectric material has a dielectric constant greater than about 10.

34. The method of claim 32, wherein a high k dielectric material comprises at least two constituents selected from the group consisting of Zr, Hf, Si, Ge, Y, and Al.

* * * * *

UNITED STATES PATENT AND TRADEMARK OFFICE
CERTIFICATE OF CORRECTION

PATENT NO. : 6,835,667 B2  
DATED : December 28, 2004  
INVENTOR(S) : Kurt K. Christenson et al.

Page 1 of 1

It is certified that error appears in the above-identified patent and that said Letters Patent is hereby corrected as shown below:

<u>Column 7,</u>  
Line 14, delete "favor F as the" and insert in place thereof -- favor $F^-$ as the --.

<u>Column 9,</u>  
Line 2, delete "supplying F– from" and insert in place thereof -- supplying $F^-$ from --

Signed and Sealed this

Twenty-fourth Day of May, 2005

JON W. DUDAS  
*Director of the United States Patent and Trademark Office*